US012642037B2

(12) United States Patent
Pei et al.

(10) Patent No.: US 12,642,037 B2
(45) Date of Patent: May 26, 2026

(54) SYSTEM OF DETERMINING LEAKAGE OF SEMICONDUCTOR MANUFACTURING TOOL AND USAGE METHOD THEREOF

(71) Applicant: TAIWAN SEMICONDUCTOR MANUFACTURING COMPANY LTD., Hsinchu (TW)

(72) Inventors: Ming-Ying Pei, Hsinchu City (TW); Yan-Hong Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 217 days.

(21) Appl. No.: 18/459,362

(22) Filed: Aug. 31, 2023

(65) Prior Publication Data

US 2025/0079200 A1    Mar. 6, 2025

(51) Int. Cl.
*H10P 72/00* (2026.01)
*H01J 37/32* (2006.01)
*H10P 14/60* (2026.01)

(52) U.S. Cl.
CPC .... *H10P 72/0421* (2026.01); *H01J 37/32449* (2013.01); *H10P 14/6336* (2026.01); *H10P 14/6532* (2026.01); *H10P 72/0604* (2026.01)

(58) Field of Classification Search
None
See application file for complete search history.

(56) References Cited

U.S. PATENT DOCUMENTS

| | | | | |
|---|---|---|---|---|
| 5,951,834 A | * | 9/1999 | Satoh | C23C 14/54 |
| | | | | 118/712 |
| 2017/0322568 A1 | * | 11/2017 | Kumar | H01L 21/67017 |
| 2022/0128425 A1 | * | 4/2022 | Hilkene | G01M 3/202 |
| 2024/0012393 A1 | * | 1/2024 | Moradian | C23C 16/52 |

* cited by examiner

*Primary Examiner* — Shamim Ahmed
(74) *Attorney, Agent, or Firm* — WPAT LAW; Anthony King

(57) ABSTRACT

The present disclosure provides a method of determining a leakage of a semiconductor manufacturing tool. The method includes: placing a substrate including a material layer on the substrate into a chamber of the semiconductor manufacturing tool; delivering a gas into the chamber to react with the material layer; obtaining a gas composition inside the chamber; and comparing the gas composition to a referential gas composition. The leakage is determined to exist if the gas composition is substantially different from the referential gas composition.

20 Claims, 11 Drawing Sheets

200

Placing a substrate including a material layer formed thereon into a chamber of an etching tool — 201

Delivering an etchant into the chamber — 203

Decomposing the etchant to form a plasma in the chamber — 205

Obtaining a referential gas composition inside the chamber by a spectrometer — 207

Comparing a gas composition inside the chamber with the referential gas composition to determine whether gas leakage takes place — 209

Wavelength (nm)

Intensity (arbitrary unit)

SYSTEM OF DETERMINING LEAKAGE OF SEMICONDUCTOR MANUFACTURING TOOL AND USAGE METHOD THEREOF

BACKGROUND

In advanced semiconductor technologies, an etching process is a significant process in semiconductor manufacturing. A semiconductor structure may undergo multiple etching processes before it is complete.

However, during an etching process, gas leakage may sometimes occur. Such issue may not be easily detected and will impact the etching process significantly. Therefore, there is a need to monitor gas leakage during the etching process and improve the etching process.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

DETAILED DESCRIPTION

Figure 1:
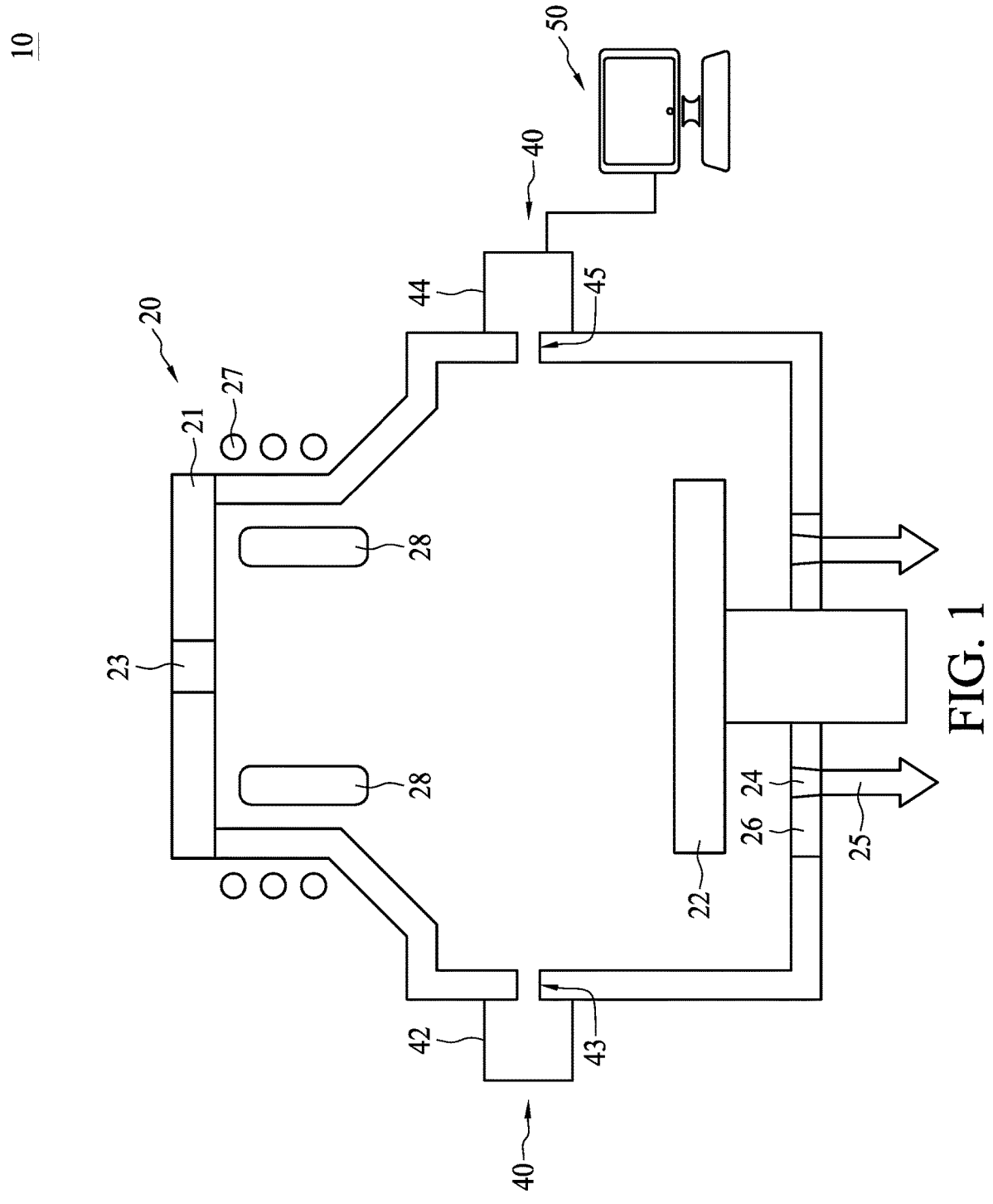
FIG. 1 is a schematic view of a semiconductor manufacturing system 10, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. Such terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all numerical ranges, amounts, values and percentages, such as those for quantities of materials, durations of time, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An etching process may be classified based on the phase of etchants (etching reagents). Gas, plasma and liquid are most common etching phases. Basically, an etching process can be categorized as either dry etching or wet etching according to the etchants used therein. Dry etching, also referred to as plasma etching, is a process of removing portions of a semiconductor material by bombarding it with ions. The ions may form a plasma of reactive gases, such as oxygen, boron, fluorocarbons, chlorine, and trichloride. A dry etching operation may proceed at a same etching rate in all directions (isotropy) or at different etching rates in different directions (anisotropy). Wet etching, also referred to as chemical etching, is a process of removing portions of a semiconductor material using a liquid reactant. A selectivity of a wet etching operation is high because chemicals used can be adapted very precisely to individual films.

The present disclosure provides a semiconductor manufacturing system 10. FIG. 1 is a schematic view of the semiconductor manufacturing system 10. In some embodiments, the semiconductor manufacturing system 10 includes a semiconductor manufacturing tool. In some embodiments, the semiconductor manufacturing tool is an etching tool 20. In some embodiments, the etching tool 20 is a dry etching tool. FIG. 1 shows the etching tool 20 as a type of reactive ion etching (RIE) tool, as an example. Simply put, RIE uses chemically reactive plasma to remove materials formed on a wafer. In RIE, etching characteristics (etch profile, etch rate, selectivity, uniformity and reproducibility) may be precisely adjusted. Both anisotropic and isotropic etch profiles are possible.

The etching tool 20 may at least include a chamber 21, a chuck 22 (such as a substrate holder), an inlet 23, an outlet 24, a vacuum pumping system 25, a pressure gauge 26, a power source 27 and a pair of electrodes 28. The etching tool 20 can be configured to process a substrate 100 of any size such as 200 millimeters (mm), 300 mm, 450 mm or larger. The chamber 21 may be a cylindrical chamber with the chuck 22 situated at its bottom portion. The chuck 22 can be used to affix the substrate 100 to be processed at a near-ambient temperature during an etching operation. The inlet 23 and the outlet 24 are coupled to the chamber 21 for receiving an etchant and discharging the etchant, respectively. The inlet 23 and the outlet 24 may be designed at a top portion and the bottom portion of the chamber 21, respectively.

The vacuum pumping system 25 may be disposed at the bottom portion of the chamber 21 and communicates with the outlet 24. The pressure gauge 26 may be disposed at any appropriate position in the chamber 21. For example, the pressure gauge 26 may be installed adjacent to the outlet 24 and the vacuum pumping system 25. The vacuum pumping system 25 can be used to pump continuously to maintain a low pressure in the chamber 21, and the pressure gauge 26 can be used to measure the low pressure in the chamber 21. The pressure in the chamber 21 is typically in a range between a few millitorr (mT) and a few hundred mT. The power source 27 and the pair of electrodes 28 function to generate reactive species. The power source 27 may include multiple spiral coils which provide radio frequency (RF) power, and the pair of electrodes 28 may be energized by the power source 27.

Still referring to FIG. 1, the semiconductor manufacturing system 10 may include various detectors disposed outside the chamber 21. In some embodiments, a spectrometer 40 is disposed exterior to the chamber 21 and electrically coupled to the etching tool 20. The spectrometer 40 may include a light source 42 and a detector 44. In some embodiments, the light source 42 and the detector 44 are disposed at opposite sides of the chamber 21. An electromagnetic radiation having a predetermined wavelength can be generated by the light source 42 and introduced to the inside of the chamber 21 through a first slit 43 connected to the light source 42. The electromagnetic radiation can be collimated onto the detector 44 through a second slit 45 connected to the detector 44 and opposite to the first slit 43. Optical elements (not shown) such as a monochromator may be used in a light path between the first slit 43 and the second slit 45. In some embodiments, the semiconductor manufacturing system 10 further includes a processor 50 electrically coupled to the spectrometer 40. The processor 50 may be used to store or process data measured by the spectrometer 40.

Although not specifically illustrated in FIG. 1, the chamber 21 may contain various seals that allow different parts to be attached to the chamber 21 without allowing any air from outside the chamber 21 to penetrate into the chamber 21. One example of such seals is O-rings that keep the chamber 21 airtight. The O-rings can be removed when necessary, such as for maintenance or repair of components inside the chamber 21.

Figure 2:
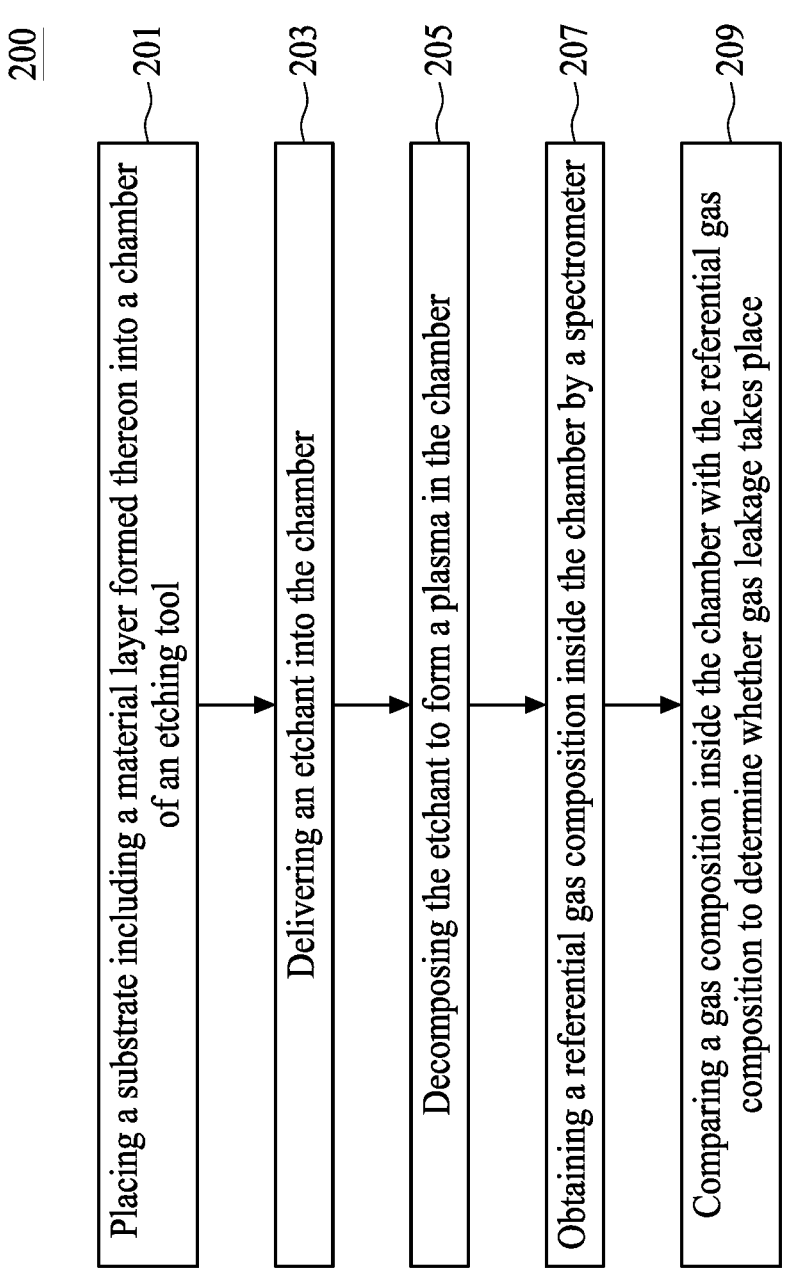
FIG. 2 is a flow diagram showing a method 200 of determining gas leakage of a semiconductor manufacturing tool during fabrication, in accordance with some embodiments of the present disclosure.

FIG. 2 is a flow diagram showing a method 200 of determining gas leakage of a semiconductor manufacturing tool during fabrication. FIGS. 3 to 11 are schematic views of microscopic processes that occur during an etching operation, along with spectra showing sequential operations of the method 200. The method 200 includes several operations (201, 203, 205, 207 and 209) and the description and illustration are not deemed as a limitation to the sequence of the operations.

Figure 3:
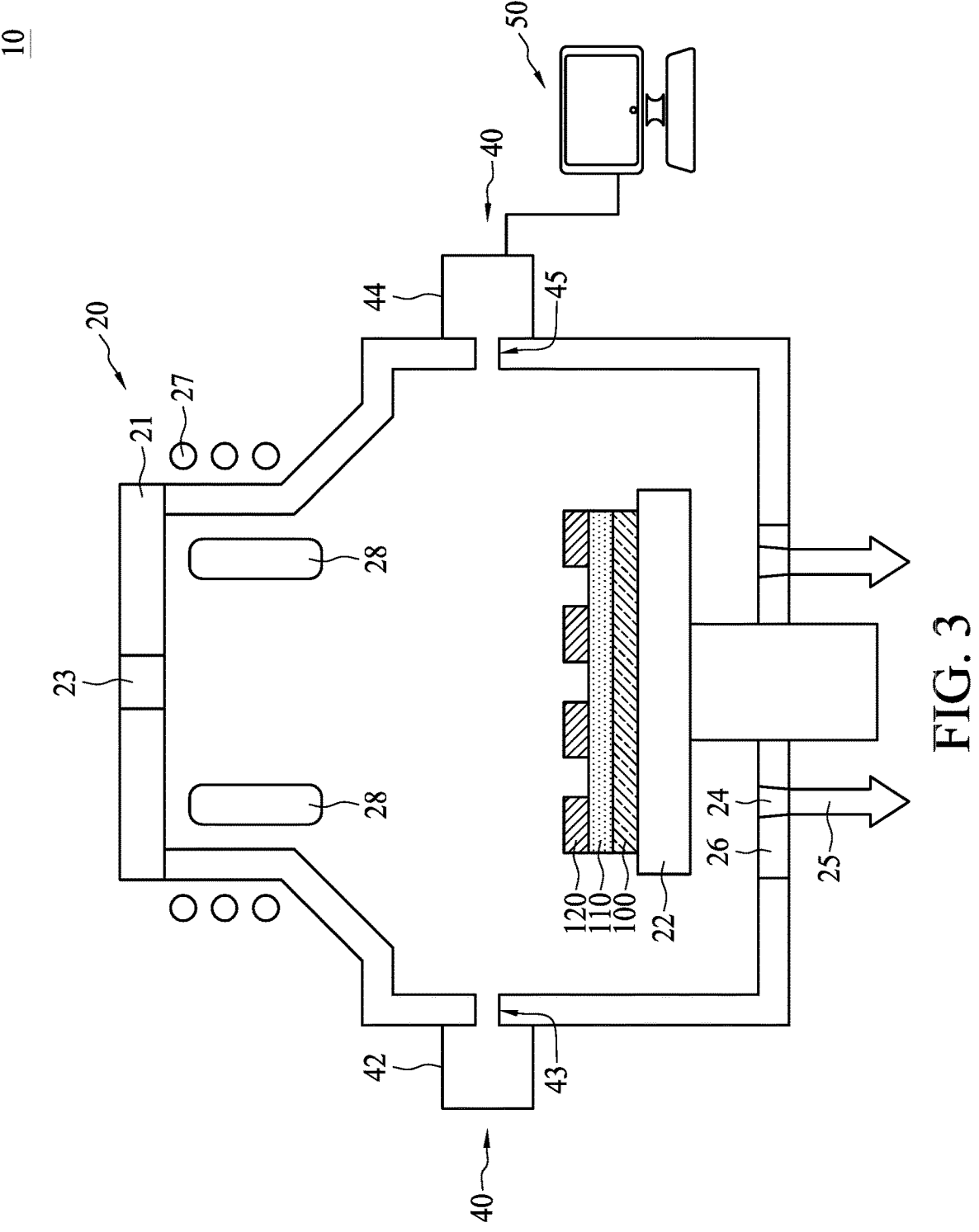
FIGS. 3 to 6, 8 and 10 are schematic views of microscopic processes that occur during an etching operation, in accordance with some embodiments of the present disclosure.

In operation 201 of FIG. 2, a substrate 100 including a material layer 110 formed thereon is placed into a chamber 21 of an etching tool 20, as shown in FIG. 3. The substrate 100 may be a wafer, a liquid crystal display (LCD) or the like. The material layer 110 may include a dielectric layer, a metallic layer, a semiconductor layer, a ceramic layer, a glass layer or the like. Before the substrate 100 is loaded into the chamber 21, a mask layer 120 may be formed on the material layer 110. The mask layer 120 may be a photoresist layer or a hard mask layer having various patterns formed via a photolithographic process. The patterns may include strips or holes that expose portions of the underlying material layer 110. Furthermore, the mask layer 120 may include additional layers, e.g., a bi-layer or tri-layer mask. For instance, the mask layer 120 may include a soft mask layer, an anti-reflective coating (ARC), a hard mask layer, or any combination of two or more thereof. Therefore, the substrate 100 with the material layer 110 and the mask layer 120 formed thereon is placed in the chamber 21.

The substrate 100 to be processed by the etching tool 20 may be supported by a chuck 22 at a central area of the bottom portion of the chamber 21. A vacuum pumping system 25 may be coupled to the chamber 21 to evacuate the chamber 21 to a predetermined vacuum level. A pressure gauge 26 may be installed adjacent to the vacuum pumping system 25 to measure the pressure in the chamber 21. The pressure in the chamber 21 may be in a range between about 3 mT and about 10 mT. Therefore, very little air is present in the chamber 21, and a probability of the material layer 110 reacting with a gas can be reduced.

Figure 4:
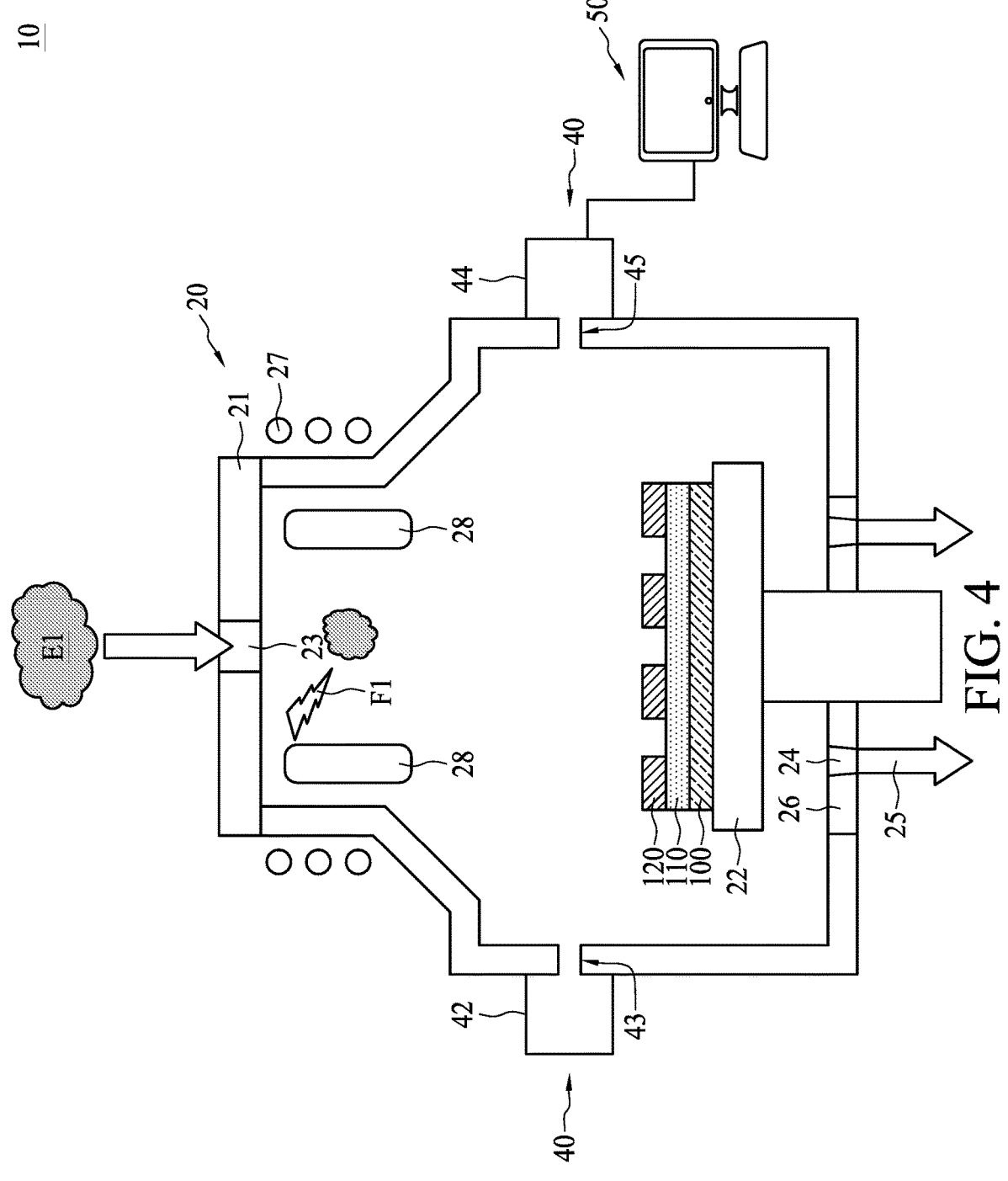

In operation 203 of FIG. 2, an etchant E1 is delivered into the chamber 21, as shown in FIG. 4. The etchant E1 may be used to react with the material layer 110 on the substrate 100. That is, the etchant E1 may be exclusively reactive to the material layer 110. In some embodiments, the etchant E1 is a gas or a material vaporized in a gaseous state. Therefore, the etchant E1 may be referred to as a process gas. The etchant E1 may be injected into the chamber 21 through an inlet 23 and discharged out of the chamber 21 through an outlet 24. The inlet 23 and the outlet 24 are in communication with the chamber 21. Because the vacuum pumping system 25 continuously evacuates the chamber 21, the etchant E1 may be drawn toward the substrate 100.

Figure 5:
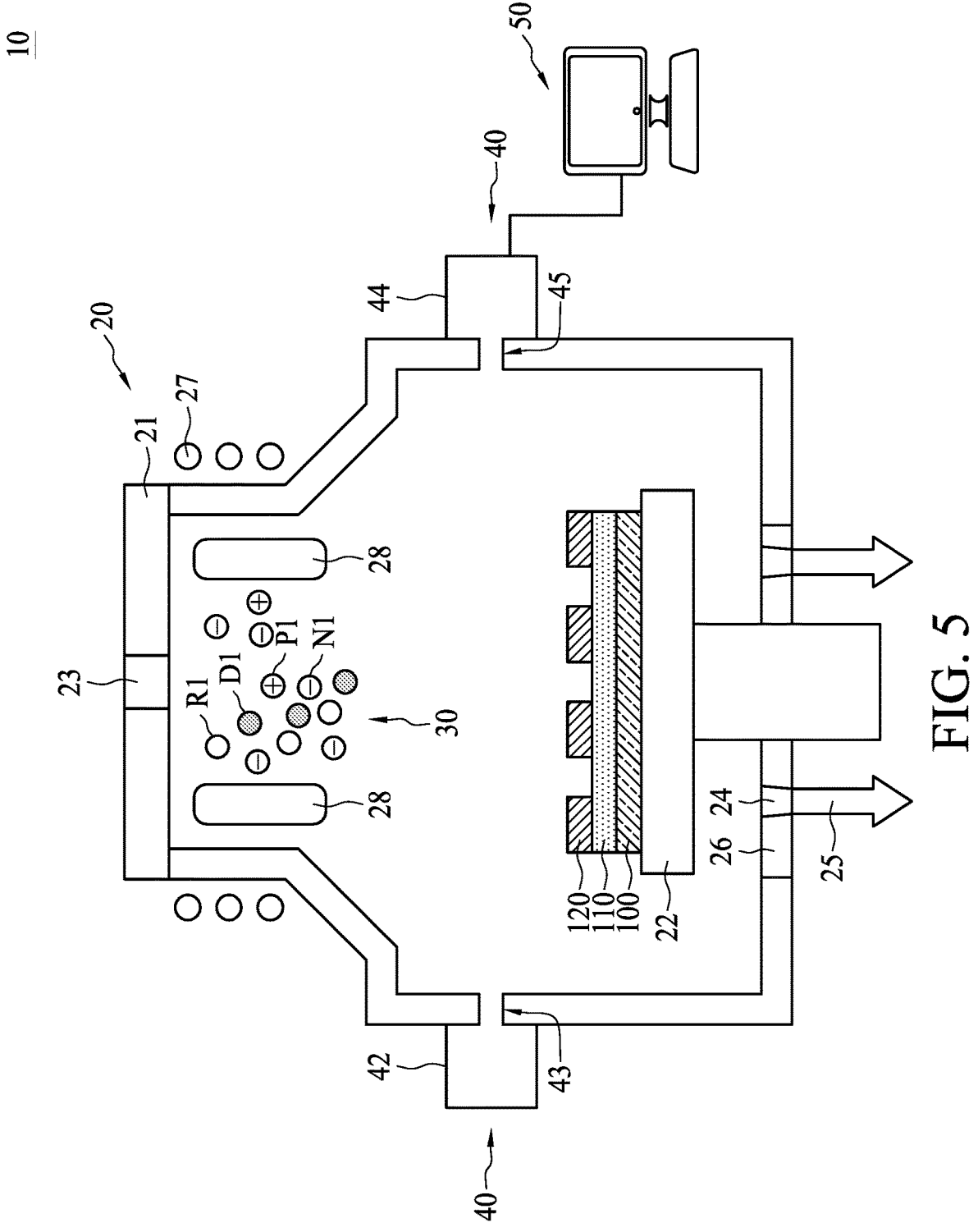

In operation 205 of FIG. 2, the etchant E1 is decomposed to form a plasma 30 in the chamber 21, as shown in FIG. 5. Shortly after the etchant E1 enters the chamber 21, some of the etchant E1 is ionized by a strong electric field F1 generated between a pair of electrodes 28 energized by a power source 27. The pair of electrodes 28 may be disposed closer to the inlet 23, which facilitates the generation of the plasma 30 when the etchant E1 passes through the pair of electrodes 28. The electric field F1 may be applied at a few hundred watts (W) and set to a frequency between about 10 megahertz (MHz) and about 15 MHz. After being excited by the electric field F1, the etchant E1 may be reduced into electrons, ions and free radicals, thus creating the plasma 30. The plasma 30 may include several reactive species such as high-energy electrons, positive ions (cations) P1, negative ions (anions) N1 or free radicals R1. Different types of collisions may occur in the plasma 30 to stabilize it. For example, high-energy electrons may collide with neutral gaseous molecules to form ionized reactive species. Excitation and relaxation processes may occur continuously in the plasma 30 and cause the plasma 30 to grow. Furthermore, more neutral gaseous molecules of the etchant E1 are dissociated to form more free radicals R1. The etchant E1 is not completely decomposed by the electric field F1. The undecomposed or partially decomposed etchant E1 may be referred to as a residual etchant D1. The residual etchant D1 is a mixture of undissociated gaseous molecules and their fragments.

Figure 6:
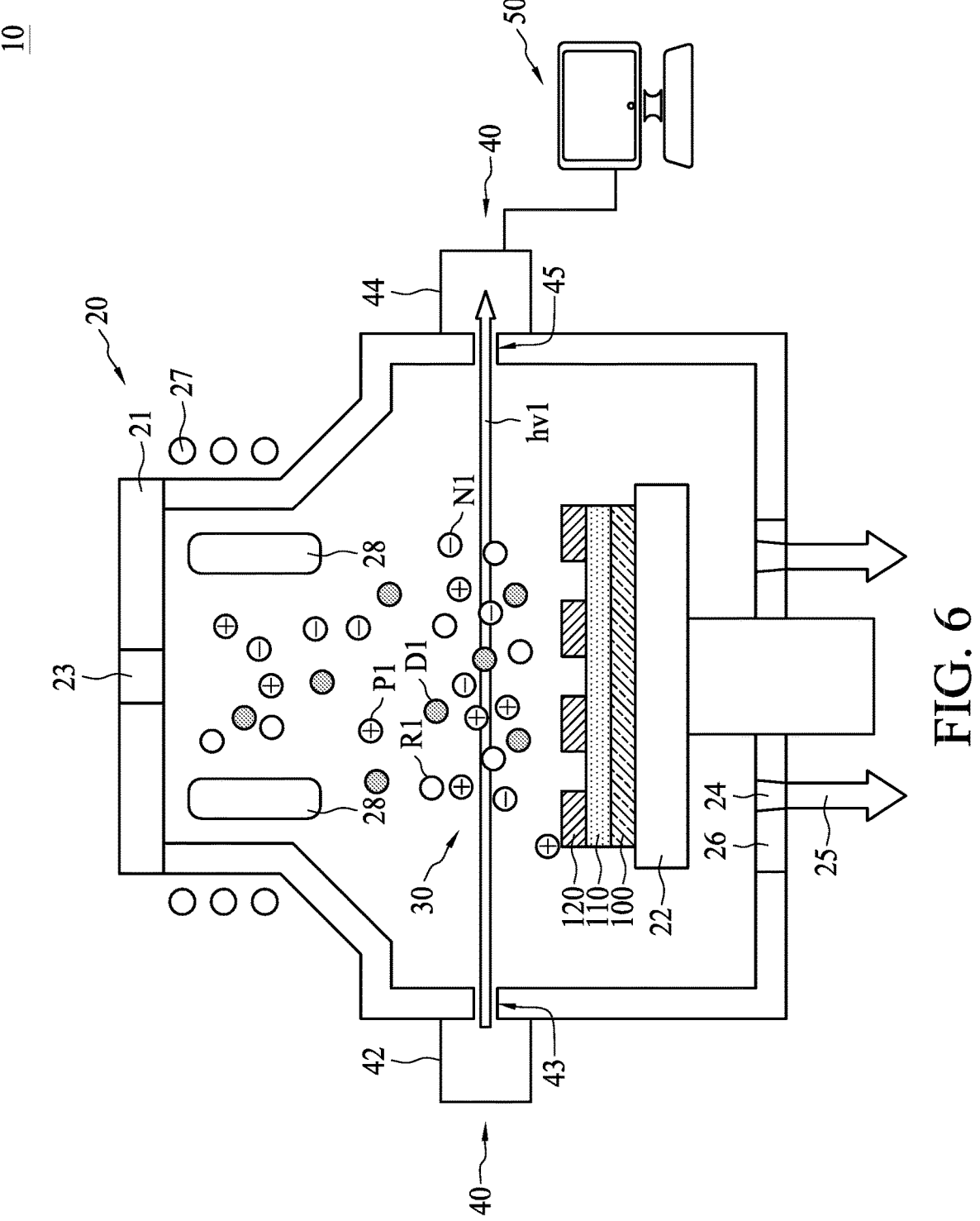

In operation 207 of FIG. 2, a referential gas composition inside the chamber 21 is obtained by a spectrometer 40, as shown in FIGS. 6 to 9. Referring to FIG. 6, gas species of the plasma 30 such as the positive ions P1, the negative ions N1, the free radicals R1 or the like are accelerated up and down in the chamber 21 and flow toward the substrate 100. Before the gas species of the plasma 30 reach the substrate 100, the spectrometer 40 may be used to analyze components of the gas species. In some embodiments, the spectrometer 40 is electrically coupled to the etching tool 20 and disposed on an exterior wall of the chamber 21. The spectrometer 40 may be a spectrometer based on absorption spectroscopy, emission spectroscopy or scattering spectroscopy. In some embodiments, the spectrometer 40 includes an infrared (IR) spectrometer, a UV-visible spectrometer, an optical emission spectrometer (OES), a mass spectrometer or the like.

The spectrometer 40 may include a light source 42 and a detector 44 disposed at opposite sides of the chamber 21. In some embodiments, the light source 42 emits an electromagnetic radiation (i.e., light) hv1 that passes through the plasma 30, as shown in FIG. 6. The electromagnetic radiation hv1 may be generated by the light source 42 and introduced to the inside of the chamber 21 through a first slit 43. The electromagnetic radiation hv1 may be collimated onto the detector 44 through a second slit 45. A beam of the electromagnetic radiation hv1 is directed to a region where the plasma 30 exists. The gas species of the plasma 30 may interact with the electromagnetic radiation hv1 and change properties of the electromagnetic radiation hv1. The electromagnetic radiation hv1 passing through the plasma 30 is then received by the detector 44 to generate a spectrum.

Figure 7:
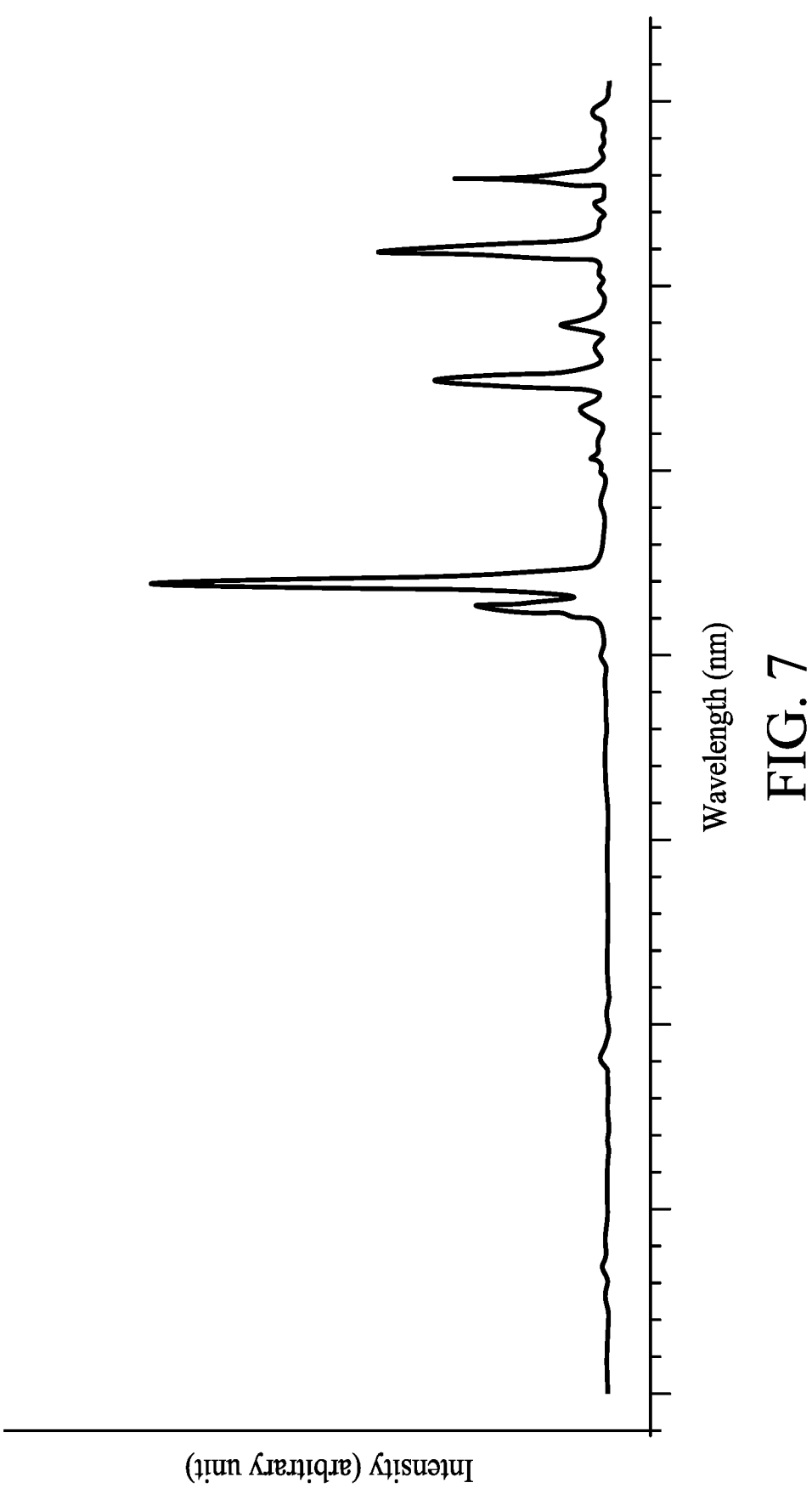
FIGS. 7, 9 and 11 are schematic diagrams of spectra obtained at different stages or in different situations of the etching operation, in accordance with some embodiments of the present disclosure.

FIG. 7 is a schematic diagram of a spectrum obtained before the reactive species of the plasma 30 react with the material layer 110. The horizontal axis represents wavelength of the received light hv1, and the vertical axis represents intensity of the received light hv1. In some embodiments, if the spectrometer 40 is an optical emission spectrometer, the gas species of the plasma 30 can absorb energy that moves their electrons from a ground state to an excited state. As one or more of the excited electrons returns from a higher energy level to a lower energy level, light of a specific wavelength is emitted. Such light may be referred to as an optical emission. Wavelengths of such optical emissions are characteristic of specific gas species of the plasma 30. Different types of atoms or ions of the gas species from the plasma 30 (i.e., which elements are present) can be determined according to the specific wavelengths of the emitted light.

As a result, the gas composition inside the chamber 21, particularly components of the gas species of the plasma 30, can be obtained using the spectrometer 40. In some embodiments, the spectrometer 40 generates a new spectrum every 10 to 20 seconds. Therefore, the gas composition inside the chamber 21 can be promptly detected. When the etching tool 20 is operating normally, there may be substantially no difference between peaks (optical signals) of the spectra. As such, the gas composition inside the chamber 21 can be referred to as the referential gas composition, and the spectrum corresponding to the referential gas composition can be referred to as a referential spectrum. The referential gas composition and the referential spectrum may be transmitted to a processor 50 electrically coupled to the spectrometer 40. The processor 50 may be used to store or process data measured by the spectrometer 40.

Furthermore, an intensity of each optical emission at a certain wavelength is proportional to a number of atoms or ions causing the transition (i.e., excited electrons returning from a higher energy level to a lower energy level). Therefore, a representative amount or concentration of the gas species in the plasma 30 can be measured as a function of the intensity of each of the optical emissions. That is, the spectrometer 40 can be used quantitatively as a chemical component analysis device.

In some other embodiments, if the spectrometer 40 is an IR spectrometer, an infrared absorption is used in place of the optical emission, and a corresponding IR spectrum may be obtained. The IR spectrum may be similar to the spectrum in FIG. 7 and can be used to analyze the gas composition inside the chamber 21. In some other embodiments, an elemental analysis device or analyzer is used in place of the spectrometer 40. The elemental analysis device can also be used to obtain information of the gas species of the plasma 30.

Figure 8:
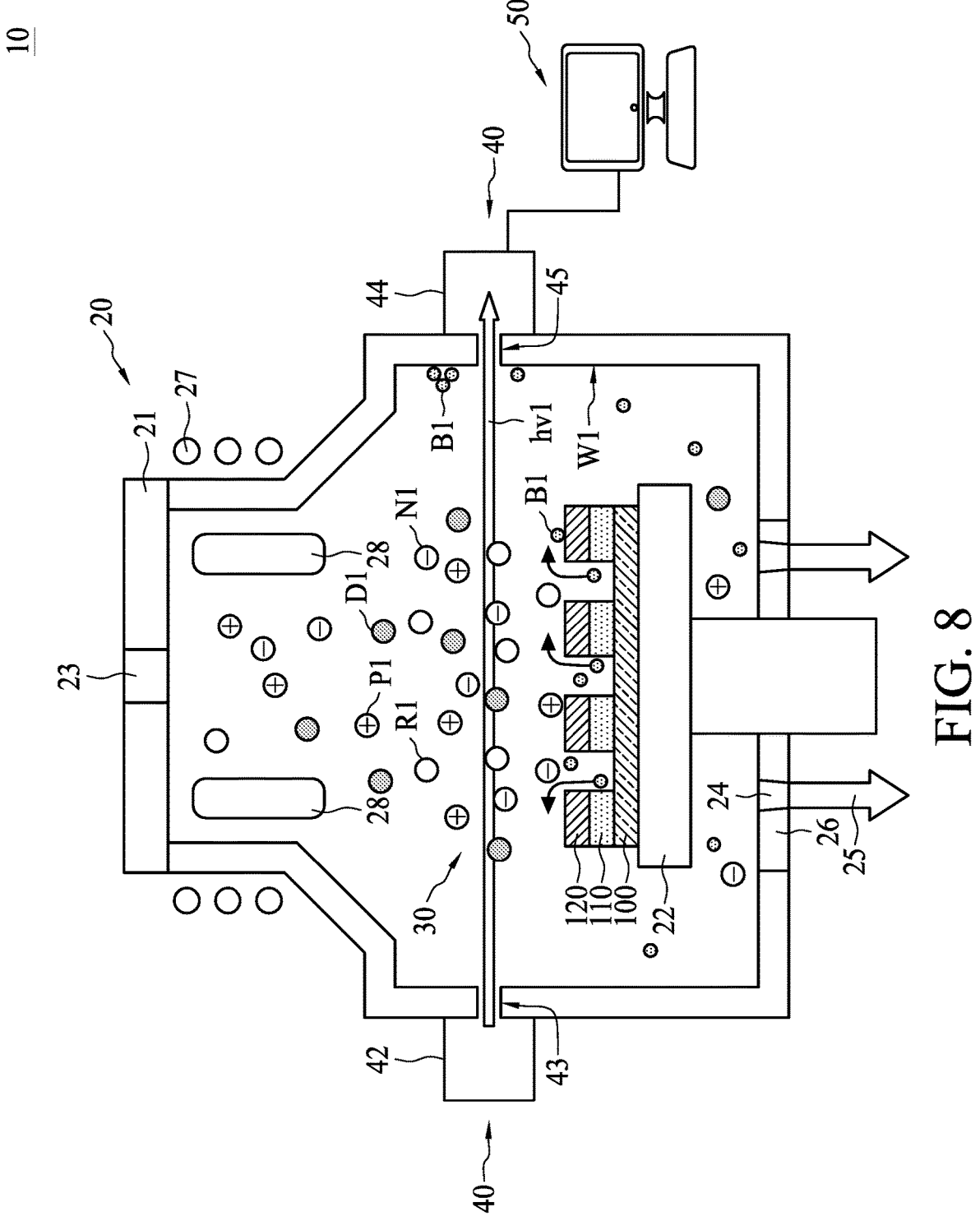

Referring to FIG. 8, after the reactive species of the plasma 30 reach the substrate 100, they may collide with portions of the material layer 110 which are not protected by the mask layer 120. The reactive species of the plasma 30 may react physically and chemically with the material layer 110 and knock off portions of the material layer 110 by transferring some of the reactive species' kinetic energy. The reacted and/or knocked-off portions of the material layer 110 form etching byproducts B1. The etching byproducts B1 may be gas molecules or may tend to be in a gaseous form.

In some the embodiments, etching byproducts B1 include tetrafluoromethane ($CF_4$), fluoroform ($CHF_3$), hexafluoro-cyclobutene ($C_4F_6$), hexafluoro-1,3-butadiene ($C_4F_6$), sulfur hexafluoride ($SF_6$), carbon monoxide (CO), octafluorocy-clobutane ($C_4F_8$), hexafluoroethane ($C_2F_6$), chlorine ($Cl_2$), boron trichloride ($BCl_3$), aluminum chloride ($AlCl_3$), aluminum fluoride ($AlF_3$), or the like.

Generally, the etching byproducts B1 may be able to evaporate away from the etched material layer 110. In some cases, the etching byproducts B1 may remain on the etched material layer 110 as a deposited thin film and impede the etching operation. In some cases, the etching byproducts B1 may remain on a sidewall W1 of the chamber 21. The etching byproducts B1 accumulating on the sidewall W1 may form a deposit, which may peel off and become contaminant particles when an amount of the deposit reaches a certain level. If the contaminant particles fall on the substrate 100, they may cause failure of the etching operation which could result in random yield loss and reduced productivity.

Therefore, the etching byproducts B1 need to be promptly pumped out from the chamber 21. The vacuum pumping system 25 may be used to desorb the etching byproducts B1 from the sidewall W1 or from the material layer 110 by continuous pumping. The outlet 24 may be used to discharge the etching byproducts B1 from the etching tool 20. In some embodiments, the residual etchant D1 and portions of the positive ions P1, the negative ions N1 or the free radicals R1 which do not bombard the material layer 110 are discharged concurrently with the etching byproducts B1. When the etching byproducts B1 and the unreacted etchant are pumped out from the chamber 21, the vacuum pumping system 25 still maintains a low pressure in the chamber 21.

During the etching operation, the reactive species of the plasma 30 specifically react with the material layer 110 to cause the material layer 110 to be etched at a higher rate than other materials such as the mask layer 120 and the substrate 100. That is, portions of the material layer 110 are etched by the etching tool 20. As a result, the pattern of the mask layer 120 is transferred to the underlying material layer 110.

Because of the existence of the etching byproducts B1 in the chamber 21, the electromagnetic radiation hv1 may pass through the etching byproducts B1. The etching byproducts B1 may interact with the electromagnetic radiation hv1 and change properties of the electromagnetic radiation hv1. A different spectrum may be obtained because the electromagnetic radiation hv1 passes through the etching byproducts B1 before it is received by the detector 44.

Figure 9:
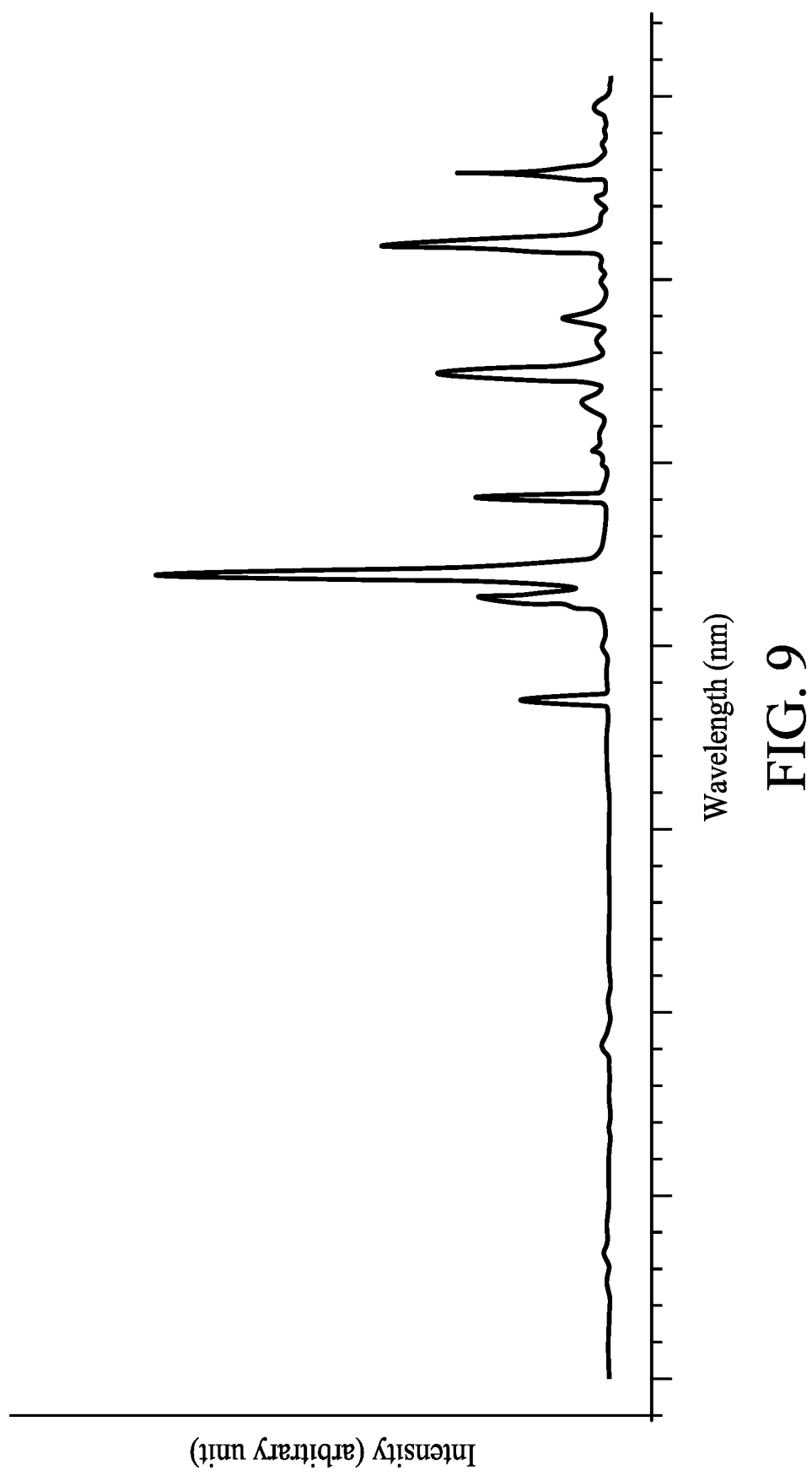

FIG. 9 is a schematic diagram of a spectrum obtained after the reactive species of the plasma 30 react with the material layer 110. FIG. 9 shows extra peaks when compared to FIG. 7. The appearance of the extra peaks may be due to the etching byproducts B1 detected by the spectrometer 40. In some embodiments, the gas composition in the chamber 21 is measured before, during or after the material layer 110 reacts with the plasma 30. That is, the spectrometer 40 continuously detects the gas composition inside the chamber 21 while the etching tool 20 is in operation. The spectrum measured by the spectrometer 40 can be updated over time. As long as the etching tool 20 is operating normally, peaks of the spectra may be substantially the same. Therefore, the spectra obtained before and after the reactive species of the plasma 30 react with the material layer 110, for example FIGS. 7 and 9, can be viewed as referential spectra and used to create a database.

Figure 10:
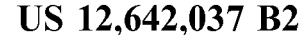
Figure 11:
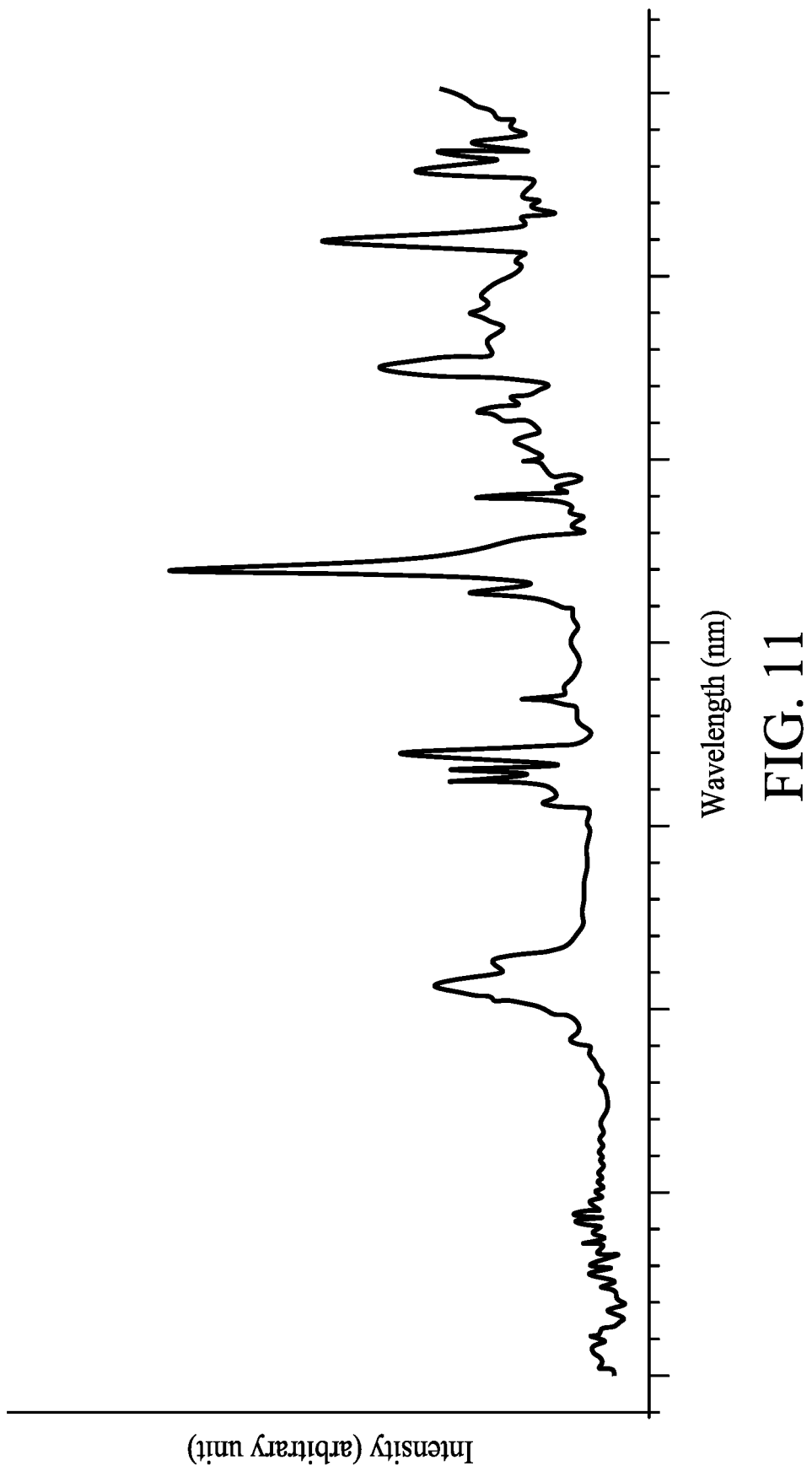

In operation 209 of FIG. 2, a gas composition inside the chamber 21 is compared to the referential gas composition to determine whether gas leakage occurs, as shown in FIGS. 10 and 11. Referring to FIG. 10, although not specifically illustrated, the chamber 21 may include multiple seals of different sizes. The seals can allow different parts attached to or assembled in the chamber 21 without allowing any air from outside to enter the chamber 21. One example of such seals is O-rings that keep the chamber 21 airtight. The O-rings are removed when necessary, such as for maintenance or repair of components of the etching tool 20.

However, sometimes a tiny hole may be present in any portion of the chamber 21. FIG. 10 is an exaggerated figure that shows the chamber 21 having a leakage L1. The appearance of the leakage L1 may be due to different reasons. For example, from time to time, one or more of the seals might not seat properly, or they might degrade with time. The leakage L1 may allow unwanted gases 60 to penetrate into the chamber 21. The unwanted gases 60 may include, for example, air, vapor or other process gases. If the unwanted gases 60 enter the chamber 21 via the leakage L1, the material layer 110 may be contaminated. For example, the material layer 110 may be oxidized. Furthermore, if the unwanted gases 60 are present in the chamber 21, unwanted reactions may take place in the plasma 30 during the etching of the material layer 110. For example, the electric field F1 generated between the pair of electrodes 28 may decompose nitrogen ($N_2$), oxygen ($O_2$) or moisture ($H_2O$) of the unwanted gases 60 to form impurities. Once the plasma 30 includes such impurities, the etching operation may fail.

When the leakage L1 of gas occurs, a control mechanism of the vacuum pumping system 25 may be activated to enhance the pumping capacity to evacuate the chamber 21. That is, the vacuum pumping system may pump harder to maintain the low pressure in the chamber 21. Therefore, if the leakage L1 is not excessively large, a value on a display of the pressure gauge 26 may still be within an acceptable range. That is, the pressure gauge 26 may not show any abnormality; for example, the value shown on the display of the pressure gauge 26 may still be between 3 mT and 10 mT. However, the vacuum pumping system 25 not only pumps out the unwanted gases 60 but also the reactive species of the plasma 30. As such, although the pressure in the chamber 21 still remains acceptably low, the gas composition inside the chamber 21 is different. As a result, only the vacuum pumping system 25 and the pressure gauge 26 are used, and occurrence of the gas leakage of the chamber 21 cannot be promptly detected or discovered.

To overcome the above issue, the spectrometer 40 may be continuously used to monitor the gas composition in the chamber 21 while the etching tool 20 is in operation. Once the unwanted gases 60 leak into the chamber 21, the electromagnetic radiation hv1 generated from the light source 42 may pass through the unwanted gases 60. As such, the unwanted gases 60 will interact with the electromagnetic radiation hv1 and change properties of the electromagnetic radiation hv1. A different spectrum may be obtained because the electromagnetic radiation hv1 passes through the unwanted gases 60 before it is received by the detector 44.

FIG. 11 is a schematic diagram of an abnormal spectrum obtained when gas leakage of the chamber 21 occurs. FIG. 11 shows extra peaks (optical signals) and multiple noise signals when compared to FIG. 9, which is the referential spectrum. The appearance of such peaks may be due to the unwanted gases 60 being detected by the spectrometer 40. The unwanted gases 60 may include nitrogen ($N_2$), oxygen ($O_2$), argon (Ar), moisture or the like, and the species may bring about additional optical signals, thereby resulting in the extra peaks in the spectrum. Furthermore, when comparing the abnormal spectrum to the referential spectrum, some peaks may have increasing or decreasing intensities. In some of the abnormal spectra, some peaks may shift to other wavelengths. The abnormal spectrum can be used as an indication to detect gas leakage.

In some embodiments, the processor 50 is used to compare a gas composition in the chamber 21 obtained at a time interval to the referential gas composition. In some embodiments, the time interval is between about 10 seconds and about 20 seconds. Any leakage such as the leakage L1 can be determined to exist when a difference between the gas composition and the referential gas composition exists. In some embodiments, the processor 50 is capable of executing an automatic gas leakage detection for the chamber 21 by continuously comparing newly generated spectra to the referential spectrum. For example, when a real-time measured spectrum is significantly different from the referential spectrum, the processor 50 may alarm or report such issue to engineers. Therefore, the spectrometer 40 and the processor 50 can function as an in-line monitor of gas leakage. That is, the comparison of spectra is carried out while the etching tool 20 is in operation. The etching tool 20 does not need to be stopped to carry out a gas leakage detection.

One aspect of the present disclosure provides a method of determining a leakage of a semiconductor manufacturing tool. The method includes: placing a substrate including a material layer on the substrate into a chamber of the semiconductor manufacturing tool; delivering a gas into the chamber to react with the material layer; obtaining a gas composition inside the chamber; and comparing the gas composition to a referential gas composition. The leakage is determined to exist if the gas composition is substantially different from the referential gas composition.

One aspect of the present disclosure provides a method of determining a gas leakage of an etching tool. The method includes: loading a substrate including a material layer on the substrate into a chamber of the etching tool; delivering an etchant into the chamber to process the material layer; obtaining a first gas composition inside the chamber by a first detector, and obtaining a first pressure inside the chamber by a second detector; pumping out a byproduct formed from the material layer and the etchant, and a residual etchant to maintain the chamber under the first pressure; obtaining a second gas composition inside the chamber by the first detector, and obtaining a second pressure inside the chamber by the second detector; and determining the gas leakage by comparing the first gas composition to the second gas composition.

Another aspect of the present disclosure provides a semiconductor manufacturing system. The semiconductor manufacturing system includes: a chamber, including an inlet allowing a gas to flow into the chamber; a detector, configured to obtain a gas composition inside the chamber; and a processor, electrically coupled to the detector and configured to execute an automatic gas leakage detection for the chamber at a time interval.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining a leakage of a semiconductor manufacturing tool, the method comprising:
   placing a substrate including a material layer on the substrate into a chamber of the semiconductor manufacturing tool;
   delivering a gas into the chamber to react with the material layer;
   obtaining a gas composition inside the chamber;
   comparing the gas composition to a referential gas composition by a processor, wherein the leakage of unwanted gases is determined to exist by a processor if the gas composition is substantially different from the referential gas composition; and
   removing the unwanted gases from the chamber in response to determination of the leakage of the unwanted gases.

2. The method of claim 1, further comprising, prior to the obtaining of the gas composition inside the chamber, evacuating the chamber to be substantially a vacuum.

3. The method of claim 1, wherein during the obtaining of the gas composition or the comparing of the gas composition to the referential gas composition, the material layer is reacted with the gas.

4. The method of claim 1, wherein the semiconductor manufacturing tool is an etching tool, and the gas composition inside the chamber is obtained by a spectrometer.

5. The method of claim 4, wherein during the obtaining of the gas composition inside the chamber, a source emits an electromagnetic radiation passing through the gas inside the chamber.

6. The method of claim 5, wherein the spectrometer is disposed exterior to the chamber, and the electromagnetic radiation passing through the gas is received by the spectrometer to generate a first spectrum.

7. The method of claim 6, wherein the leakage is determined to exist based on a difference between the first spectrum and a second spectrum corresponding to the referential gas composition.

8. The method of claim 1, wherein the gas composition inside the chamber is obtained by a spectrometer and is transmitted to the processor electrically coupled to the spectrometer, and the referential gas composition is stored in the processor.

9. The method of claim 1, wherein comparing the gas composition to a referential gas composition comprises is based on a change of optical signals including a difference in peak intensity, a shift of a peak or a presence of an additional signal.

10. A method of determining a leakage of a semiconductor manufacturing tool, the method comprising:
   loading a substrate including a material layer on the substrate into a chamber of the semiconductor manufacturing tool;
   delivering a gas into the chamber;
   obtaining a first gas composition inside the chamber by a first detector as a referential gas composition before the gas reacts with the material layer;
   obtaining a second gas composition inside the chamber by the first detector during or after the gas reacts with the material layer;
   comparing the second gas composition to the referential gas composition to determine the leakage of unwanted gases by a processor; and
   removing the unwanted gases from the chamber in response to determination of the leakage of the unwanted gases.

11. The method of claim 10, further comprising:
   obtaining a first pressure inside the chamber by a second detector before the gas reacts with the material layer; and
   obtaining a second pressure inside the chamber by the second detector after the gas reacts with the material layer,
   wherein the first pressure is substantially equal to the second pressure.

12. The method of claim 10, wherein the second detector is a pressure gauge.

13. The method of claim 10, wherein the comparison of the second gas composition to the referential gas composition is based on a change of optical signals.

14. The method of claim 13, wherein the change of optical signals includes a difference in peak intensity, a shift of a peak or a presence of an additional signal.

15. The method of claim 10, wherein the first detector is an infrared (IR) spectrometer, a UV-visible spectrometer, an optical emission spectrometer or a mass spectrometer.

16. The method of claim 10, wherein before the substrate is loaded into the chamber, a mask layer is formed on the material layer, wherein the gas reacts with the material layer exposed from the mask layer.

17. A method of determining a leakage of a semiconductor manufacturing tool, the method comprising:

delivering a gas into a chamber of the semiconductor manufacturing tool, wherein the chamber includes a substrate to be treated with the gas;

obtaining a first gas composition and a first pressure of the gas in a chamber of the semiconductor manufacturing tool;

obtaining a second gas composition and a second pressure of the gas in the chamber of the semiconductor manufacturing tool after obtaining the first gas composition and the first pressure;

comparing the second composition to the first gas composition by a processor, wherein the leakage of unwanted gases is determined to exist by a processor if the second composition is substantially different from the first gas composition, and wherein the first pressure is substantially equal to the second pressure; and removing the unwanted gases from the chamber in response to determination of the leakage of the unwanted gases.

18. The method of claim 17, wherein the first gas composition is detected by an absorption spectroscopy, an emission spectroscopy or a scattering spectroscopy; the second composition is detected by an absorption spectroscopy, an emission spectroscopy or a scattering spectroscopy; the first pressure and the second pressure of the gas and the second detector are detected by a pressure gauge.

19. The method of claim 17, further comprising evacuating the chamber to be substantially a vacuum prior to obtaining the second composition.

20. The method of claim 17, further comprising pumping unwanted gases out from the chamber after obtaining the first gas composition and the first pressure.

* * * * *